(12) United States Patent
Kawazoe et al.

(10) Patent No.: US 8,043,428 B2
(45) Date of Patent: Oct. 25, 2011

(54) PROCESS FOR PRODUCTION OF SILICON SINGLE CRYSTAL

(75) Inventors: Shinichi Kawazoe, Omura (JP);
Toshimichi Kubota, Omura (JP);
Yasuhito Narushima, Omura (JP);
Fukuo Ogawa, Omura (JP)

(73) Assignee: Sumco Techxiv Corporation, Omura-Shi, Nagasaki (JP)

( * ) Notice: Subject to any disclaimer, the term of this patent is extended or adjusted under 35 U.S.C. 154(b) by 0 days.

(21) Appl. No.: 12/524,303

(22) PCT Filed: May 23, 2008

(86) PCT No.: PCT/JP2008/059510
§ 371 (c)(1),
(2), (4) Date: Jan. 28, 2010

(87) PCT Pub. No.: WO2008/146724
PCT Pub. Date: Dec. 4, 2008

(65) Prior Publication Data
US 2010/0133485 A1    Jun. 3, 2010

(30) Foreign Application Priority Data
May 31, 2007 (JP) .................................. 2007-146086

(51) Int. Cl.
*C30B 15/04* (2006.01)
(52) U.S. Cl. ................ 117/21; 117/11; 117/13; 117/19; 117/73; 117/74
(58) Field of Classification Search ..................... 117/11, 117/13, 19, 20, 21, 73, 74
See application file for complete search history.

(56) References Cited

U.S. PATENT DOCUMENTS

| 6,086,670 | A | 7/2000 | Ito |
| 6,491,752 | B1 * | 12/2002 | Kirscht et al. ................ 117/21 |
| 2005/0215057 | A1 | 9/2005 | Kashima |
| 2007/0105279 | A1 * | 5/2007 | Falster et al. ................ 438/113 |

FOREIGN PATENT DOCUMENTS

| JP | 61-031382 A | 2/1986 |
| JP | 1-246197 A | 10/1989 |
| JP | 11-186121 A | 7/1999 |
| JP | 2005-314213 A | 11/2005 |

OTHER PUBLICATIONS

International Preliminary Report on Patentability and Written Opinion (in English) issued on Jan. 12, 2010 in a counterpart International Application No. PCT/JP2008/059510.
Y. Shiraishi, et al., Prediction of solid-liquid interface shape during CZ Si crystal growth using experimental and global simulation. Elsevier, Journal of Crystal Growth 266, pp. 28-33, Feb. 26, 2004.
English Language International Search Report dated Jul. 1, 2008 issued in parent Appln. No. PCT/JP2008/059510.

* cited by examiner

*Primary Examiner* — Harold Pyon
*Assistant Examiner* — Haidung Nguyen
(74) *Attorney, Agent, or Firm* — Holtz, Holtz, Goodman & Chick, P.C.

(57) ABSTRACT

In growing a silicon monocrystal from a silicon melt added with an N-type dopant by Czochralski method, the monocrystal is grown such that a relationship represented by a formula (1) as follows is satisfied. In the formula (1): a dopant concentration in the silicon melt is represented by C (atoms/cm$^3$); an average temperature gradient of the grown monocrystal is represented by Gave(K/mm); a pulling-up speed is represented by V (mm/min); and a coefficient corresponding to a kind of the dopant is represented by A. By growing the silicon monocrystal under a condition shown in the left to a critical line G1, occurrence of abnormal growth due to compositional supercooling can be prevented.

$$\frac{Gave}{V} > A \cdot C - 43 \qquad (1)$$

3 Claims, 2 Drawing Sheets

PROCESS FOR PRODUCTION OF SILICON SINGLE CRYSTAL

This application is a U.S. National Phase Application under 35 USC 371 of International Application PCT/JP2008/059510 filed May 23, 2008.

TECHNICAL FIELD

The present invention relates to a manufacturing method of a silicon monocrystal and a silicon monocrystal substrate.

BACKGROUND ART

In recent years, there has been a demand from device manufacturers for an N-type low-resistivity crystal added with N-type dopant at a high concentration (N-type highly doped monocrystal) for application in a power MOSFET (metal oxide semiconductor field effect transistor) in order to reduce "On" resistivity.

However, when an N-type dopant is added at a high concentration as described above and an ingot is pulled up by Czochralski method, the freezing point is depressed to a considerably large degree due to the addition of the dopant in a large amount, so that compositional supercooling may be caused.

When such compositional supercooling is large, a growth different from a silicon growth face may be initiated on a crystal growth interface, which leads to an abnormal growth (cell growth). Occurrence of such an abnormal growth during a growing phase of an ingot may hamper the monocrystallization.

In view of the above, studies on such compositional supercooling have been conducted in a field of compound semiconductor such as GaAs, InP. According to a known technique, occurrence conditions of compositional supercooling are defined based on a relationship between a temperature gradient of the semiconductor melt and a pulling-up speed (e.g., patent document 1).

Patent Document 1: JP-A-61-31382

DISCLOSURE OF THE INVENTION

Problems to be Solved by the Invention

However, since no sufficient study has been made on compositional supercooling that occurs to a silicon monocrystal added with N-type dopant at a high concentration, the technique does not provide any improvement for prevention of an abnormal growth.

In addition, while the technique disclosed in the patent document 1 requires a temperature gradient in the vicinity of a surface of the silicon melt to be known, it is not possible to actually measure such a temperature gradient. Further, while the temperature gradient of the silicon melt can be directly examined by simulation, variation in reference points poses a hurdle in obtaining reliable data.

An object of the invention is to provide a manufacturing method of a silicon monocrystal capable of stably manufacturing an N-type highly doped monocrystal without causing an abnormal growth in the crystal during growth of the silicon monocrystal by Czochralski method, and to provide a silicon monocrystal substrate.

Means for Solving the Problems

In consideration that a temperature gradient within silicon melt cannot be directly measured, the inventors have expressed a fraction between a pseudo temperature gradient GL (K/mm) within silicon melt and a pulling-up speed V (mm/min) by a fraction between an average temperature gradient Gave (K/mm) of crystal and the pulling-up speed V (mm/min) in accordance with the Stefan condition, and obtained the average temperature gradient Gave by simulation (CrysVun, STHAMAS).

By growing a silicon monocrystal at various dopant concentrations under various pulling-up conditions to see whether or not abnormal growths have occurred, and by showing the obtained results in a scatter diagram where a dopant concentration (melt concentration) C (atoms/cm$^3$) in the silicon melt is plotted on the horizontal axis while the fraction between the average temperature gradient Gave (K/mm) and the pulling-up speed V (mm/min) is plotted on the vertical axis, the inventors have reached a finding that no abnormal growth occurs within a specific region of the scatter diagram. The invention is based on this finding.

Specifically, a method of manufacturing a silicon monocrystal according to an aspect of the invention is a method of manufacturing a silicon monocrystal, the silicon monocrystal being grown from a silicon melt added with an N-type dopant by Czochralski method, the method including growing the monocrystal such that a relationship represented by a formula (1) as follows is satisfied, where: a dopant concentration in the silicon melt is represented by C (atoms/cm$^3$); an average temperature gradient of the grown monocrystal is represented by Gave(K/mm); a pulling-up speed is represented by V (mm/min); and a coefficient corresponding to a kind of the dopant is represented by A.

[Formula 1]

$$\frac{Gave}{V} > A \cdot C - 43 \quad (1)$$

The average temperature gradient Gave (K/mm) is defined as a variable that represents heat extraction ability of a CZ furnace in the vicinity of the surface of the silicon melt. For detailed definition, reference may be made to an article entitled, "Prediction of solid-liquid interface shape during CZ Si crystal growth using experimental and global simulation"

(Journal of Crystal Growth, Volume 266, Issues 1-3, 15 May 2004, Pages 28-33 Yutaka Shiraishi, Susumu Maeda and Kozo Nakamura).

While defect(s) brought to the silicon monocrystal at the time of pulling up of the crystal by Czochralski method is dependant on a crystal-axial temperature gradient of a solid-liquid interface, the solid-liquid interface is three-dimensionally shaped due to influence of various pulling-up conditions. It is highly difficult to predict the shape of the solid-liquid interface in a simulation by a computer or the like.

In view of the above, an average temperature gradient Gave (K/mm) at height positions of a grown crystal which are free from influence of the solid-liquid interface has been focused on, and experiments have been conducted. It has been consequently found that height positions of the crystal which correspond to a half of the crystal radius R (mm) are free from influence of the solid-liquid interface. Thus, the average temperature gradient Gave (K/mm) is specifically defined as follows.

The compositional supercooling, which is influenced by a temperature gradient of the silicon melt, can be expressed by an average temperature gradient Gave (K/mm) as disclosed in the above article. The compositional supercooling is considered also influenced by thermal flows at an outer circumference at the time of the pulling-up and by the silicon metal. However, by expressing the compositional supercooling by Gave (K/mm), the compositional supercooling can be considered without considering a complex three-dimensional shape of the solid-liquid interface.

Specifically, Gave (K/mm) is defined by the following formula (2), where: a crystal radius is represented by R (mm); a radial crystal position is represented by r (mm); and a crystal-axial temperature difference at the crystal position r (mm) is represented by G(r)(K).

[Formula 2]

$$\text{Gave} = \frac{2\pi \int_0^R rG(r)dr}{\pi R^2} \quad (2)$$

Gave (K/mm) as defined by the formula (2) can be controlled by controlling a structure of a hot zone or a process. For instance, methods such as enhancing heat insulation of a heat shield plate forming a part of the hot zone (i.e., increasing an amount of heat insulator contained therein), conducting forcible cooling (i.e., using a cooling tube) and narrowing a gap between the heat shield plate and the surface of the silicon melt are usable for controlling Gave (K/mm).

According to the above control factors, a practical range of Gave (K/mm) is currently set to 1.8 to 4.5 (K/mm), a lower limit of the pulling-up speed is set to 0.2 (mm/min) in terms of manufacturability, and an upper limit of the maximum pulling-up speed capable of growing a stable crystal is set to 1.3 (mm/min).

Accordingly, Gave/V is controllable within a range of 1.3<Gave/V<23.

In order to meet a demand on resistivity of a highly doped semiconductor substrate, when arsenic (As) is exemplarily used as the dopant, a dopant concentration in the silicon melt is set to be in a range of $5.67 \times 10^{19}$ to $2.11 \times 10^{20}$ (atoms/cm$^3$) [6 mΩ·cm to 1.5 mΩ·cm]. The numeric values correspond to an upper limit and a lower limit of the dopant concentration respectively. On the other hand, when phosphorus (P) is used as the dopant, the dopant concentration in the silicon melt is set to be in a range of $9.9 \times 10^{19}$ to $3.12 \times 10^{20}$ (atoms/cm$^3$) [2 mΩ·cm to 0.7 mΩ·cm]. The numeric values correspond to an upper limit and a lower limit of the dopant concentration respectively. The control may be also based on the above range of the dopant concentration.

Next, the formula (1) is obtained in the following manner.

First of all, when the Stefan condition is set as the prerequisite, a relationship represented by the following formula (3) is obtained, where: heat conductivity of the crystal is represented by $K_S$; heat conductivity of the silicon melt is represented by $K_L$; a temperature gradient of the crystal is represented by $G_S$; a temperature gradient of the silicon melt is represented by $G_L$; latent heat of silicon is represented by H; and a pulling-up speed is represented by V.

$$K_s G_s - K_L G_L = HV \quad (3)$$

By rearranging both members of the formula (3), the following formula (4) is obtained.

[Formula 4]

$$\frac{G_L}{V} = \left(\frac{K_S}{K_L}\right) \cdot \frac{G_S}{V} - \left(\frac{H}{K_L}\right) \quad (4)$$

On the other hand, according to the above-mentioned article, it has been proved that a correlation represented by the following formula (5) is satisfied between Gave and $G_S$.

[Formula 5]

$$\frac{G_S}{\text{Gave}} = a \cdot \left(\frac{V}{\text{Gave}}\right) + b \quad (5)$$
$$\therefore G_S = aV + b\text{Gave}$$

By assigning the formula (5) to the formula (4) and rearranging the formula (4), the following formula (6) is obtained.

[Formula 6]

$$\frac{G_L}{V} = \alpha \cdot \left(\frac{\text{Gave}}{V}\right) + \beta \quad (6)$$

in which: $\alpha = b\left(\frac{K_S}{K_L}\right) \beta = a\left(\frac{K_S}{K_L}\right) - \left(\frac{H}{K_L}\right)$ Further, the compositional cooling occurs when the following formula (7) is satisfied, where: a segregation coefficient is represented by k; a temperature gradient of the silicon melt is represented by $G_L$; a pulling-up speed is represented by V; a diffusion coefficient is represented by D; a dopant concentration in the silicon melt is represented by C; and a coefficient is presented by m. The dopant concentration C can be derived from resistivity of a grown crystal.

[Formula 7]

$$\frac{G_L}{V} \leq \frac{(1-k)}{kD} \cdot mC \quad (7)$$

According to the formulae (6) and (7), the compositional supercooling occurs when a relationship represented by the following formula (8) is satisfied, which expresses a condition for occurrence of the compositional supercooling by use of the dopant concentration C in the silicon melt and the average temperature gradient Gave (a variable that represents heat extraction ability in the vicinity of the surface of the silicon melt).

[Formula 8]

$$\frac{\text{Gave}}{V} \leq \frac{(1-k)}{\alpha kD} \cdot mC - \frac{\beta}{\alpha} \quad (8)$$

In other words, in a scatter diagram where the dopant concentration C (atoms/cm$^3$) in the silicon melt is plotted on the horizontal axis while the fraction between the average temperature gradient Gave (K/mm) and the pulling-up speed (mm/min) is plotted on the vertical axis, a critical line for occurrence of the compositional supercooling can be expressed as a direct function of the dopant concentration C as indicated in the formula (8). It has been found that a difference in dopant is reflected in a gradient of the direct function.

Accordingly, by preliminarily obtaining the coefficient A accorded with kinds of N-type dopant from the pulling-up speed, the average temperature gradient Gave obtained through simulation and the dopant concentration C in the silicon melt, and by actually growing a silicon monocrystal under such a pulling-up condition as to stay out of the occurrence region of abnormal growth represented by the formula (8), occurrence of abnormal growth due to the compositional cooling can be prevented.

In addition, by employing the average temperature gradient Gave (K/mm) as the parameter, a silicon monocrystal free from abnormal growth can be grown without considering the non-measurable temperature gradient of the silicon melt.

Thus, in the manufacturing method of a silicon monocrystal according to the aspect of the invention, by growing a crystal in a manner that satisfies the relationship represented by the formula (1), abnormal growth can be prevented. Though the detail will be described later, a value of the intercept on the vertical axis in the formula (1) is obtained by growing silicon monocrystals at various dopant concentrations and by actually illustrating the obtained results in a scatter diagram.

Examples of the N-type dopant preferably used in the manufacturing method of a silicon monocrystal according to the aspect of the invention include phosphorus (P), antimony (Sb) and arsenic (As). When arsenic is used, the coefficient A in the formula (1) is preferably $2.85 \times 10^{-19}$. When phosphorus is used, the coefficient A is preferably $2.00 \times 10^{-19}$.

Though the detail will be described later, the values of the coefficient A are obtained by growing silicon monocrystals at various dopant concentrations and by actually illustrating the obtained results in a scatter diagram. Likewise, values suitable for phosphorus and antimony can be obtained by growing silicon monocrystals at various dopant concentrations and by actually illustrating the obtained results in a scatter diagram.

A silicon monocrystal substrate according to another aspect of the invention is a substrate obtained from a silicon monocrystal grown from a silicon melt added with an N-type dopant by Czochralski method, the monocrystal being grown such that a relationship represented by a formula (2) as follows is satisfied, where: a dopant concentration in the silicon melt is represented by C (atoms/cm$^3$); an average temperature gradient of the grown monocrystal is represented by Gave(K/mm); a pulling-up speed is represented by V (mm/min); and a coefficient corresponding to a kind of the dopant is represented by A.

Examples of the N-type dopant preferably used in the silicon monocrystal substrate according to the aspect of the invention include phosphorus (P), antimony (Sb) and arsenic (As). When arsenic is used, the coefficient A in the formula (1) is preferably $2.85 \times 10^{-19}$. When phosphorus is used, the coefficient A is preferably $2.00 \times 10^{-19}$.

According to the aspect of the invention, the same effects and advantages as described above can be obtained.

BEST MODE FOR CARRYING OUT THE INVENTION

Exemplary embodiment(s) of the invention will be described below.

EXAMPLE 1

A silicon monocrystal was grown from a silicon melt added with an N-type dopant, arsenic (As), by Czochralski method. By changing an additive amount of arsenic, a plurality of N-type highly doped monocrystals were manufactured. The additive amount of arsenic and the pulling-up conditions for each manufactured monocrystal are shown in Tables 1 and 2.

TABLE 1

|  |  | No. 1 | No. 2 | No. 3 | No. 4 | No. 5 |
|---|---|---|---|---|---|---|
|  | Charge amount (kg) | 100 | 100 | 100 | 100 | 100 |
|  | As doping amount (g) | 800 | 800 | 800 | 900 | 900 |
| Straight-portion condition | Pulling-up speed (mm/min) | 0.75 → 0.35 | 0.75 → 0.5 | 0.75 → 0.5 | 0.75 → 0.35 | 0.75 → 0.35 |
|  | Furnace pressure (Pa) | 59985 to 6665 | 59985 | 59985 | 59985 to 6665 | 59985 to 6665 |
|  | Ar flow volume (L/min) | 200 to 50 | 200 | 200 | 200 to 50 | 200 to 50 |

TABLE 2

|  |  | No. 6 | No. 7 | No. 8 |
|---|---|---|---|---|
|  | Charge amount (kg) | 100 | 45 | 45 |
|  | As doping amount (g) | 900 | 450 | 450 |
| Straight-portion condition | Pulling-up speed (mm/min) | 0.75 ↓ 0.3 | 0.8 ↓ 0.3 | 0.8 ↓ 0.3 |
|  | Furnace pressure (Pa) | 59985 to 6665 | 59985 | 59985 |
|  | Ar flow volume (L/min) | 200 to 50 | 150 | 150 |

For each of the monocrystals grown under the conditions shown in Tables 1 and 2, an average temperature gradient Gave (K/mm) of the crystal was obtained by simulation.

Figure 1:
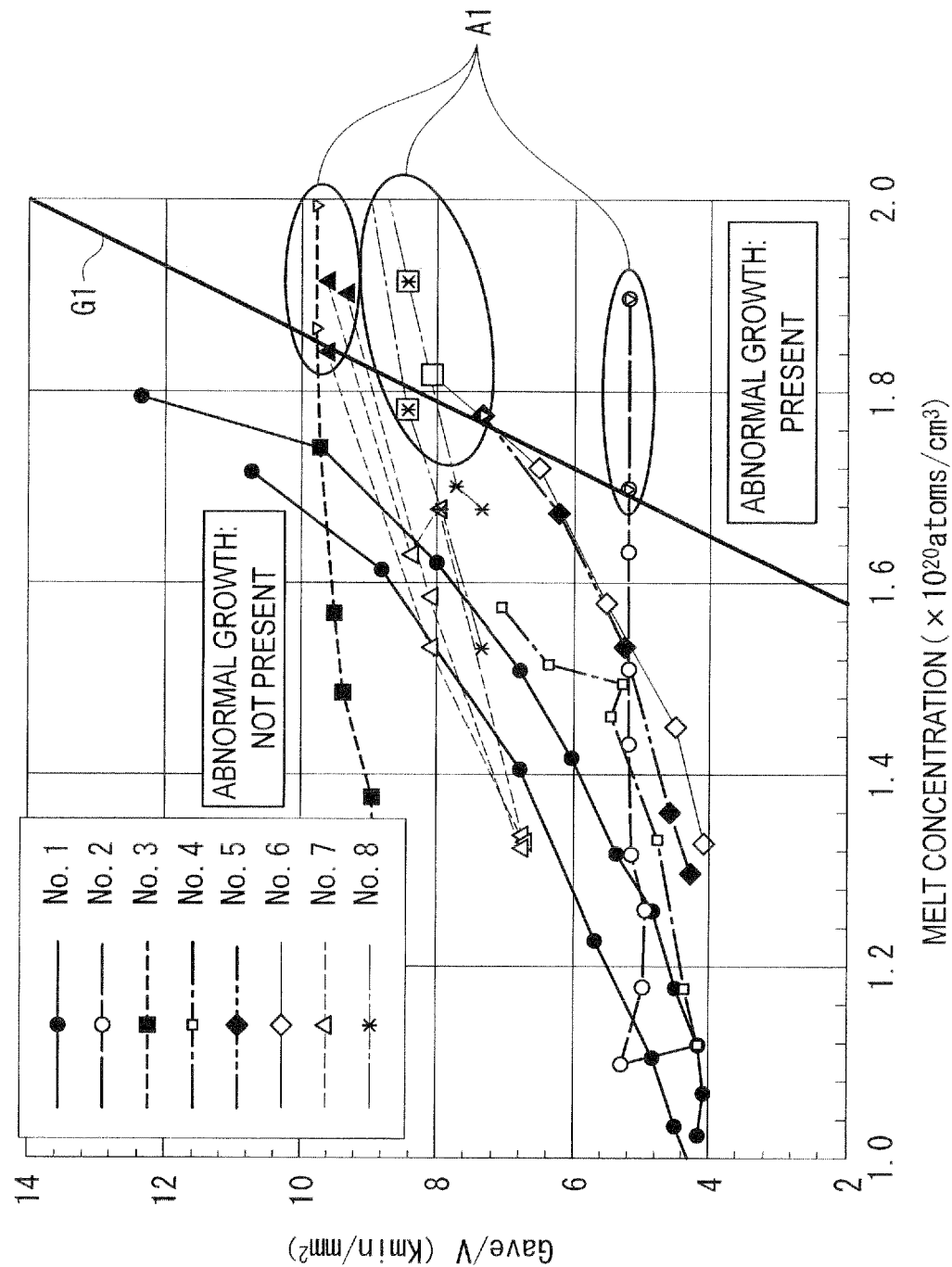
FIG. 1 is a graph showing a relationship between arsenic concentration in a silicon melt and Gave/V according to an example of the invention.

Then, a scatter diagram for showing the silicon crystals manufactured under the conditions shown in Tables 1 and 2 was drafted, in which an arsenic concentration (melt concentration) C (atoms/cm$^3$) in the silicon melt was plotted on the horizontal axis while a fraction Gave/V(Kmin/mm$^2$) between the average temperature gradient Gave (K/mm) and the pulling-up speed V (mm/min) was plotted on the vertical axis. As shown in FIG. 1, abnormal growth occurred in a region A1. It has been found that abnormal growth occurs in a region located to the right of a critical line G1 while no abnormal growth occurs in a region located to the left thereof.

At this time, a formula for representing the critical line G1 was calculated, and the following formula (9) was obtained.

[Formula 9]

$$\frac{Gave}{V} = 2.85 \times 10^{19} \times C - 43 \quad (9)$$

Accordingly, the condition for growing a silicon monocrystal without occurrence of abnormal growth is represented by the following formula (10). By growing a silicon monocrystal such that the relationship represented by the formula (10) is satisfied, abnormal growth due to compositional supercooling can be prevented.

[Formula 10]

$$\frac{Gave}{V} > 2.85 \times 10^{19} \times C - 43 \quad (10)$$

EXAMPLE 2

A silicon monocrystal was grown from a silicon melt added with an N-type dopant, phosphorus (P), by Czochralski method. By changing a phosphorus concentration of a latter half of the pulled-up crystal with use of evaporation of phosphorus during the pulling up while equalizing an additive amount of phosphorus, a plurality of N-type highly doped monocrystals were manufactured.

The additive amount of phosphorus and the pulling-up conditions for each manufactured monocrystal are shown in Tables 3 and 4.

For each of the monocrystals grown under the conditions shown in Tables 3 and 4, an average temperature gradient Gave (K/mm) of the crystal was obtained by simulation.

Figure 2:
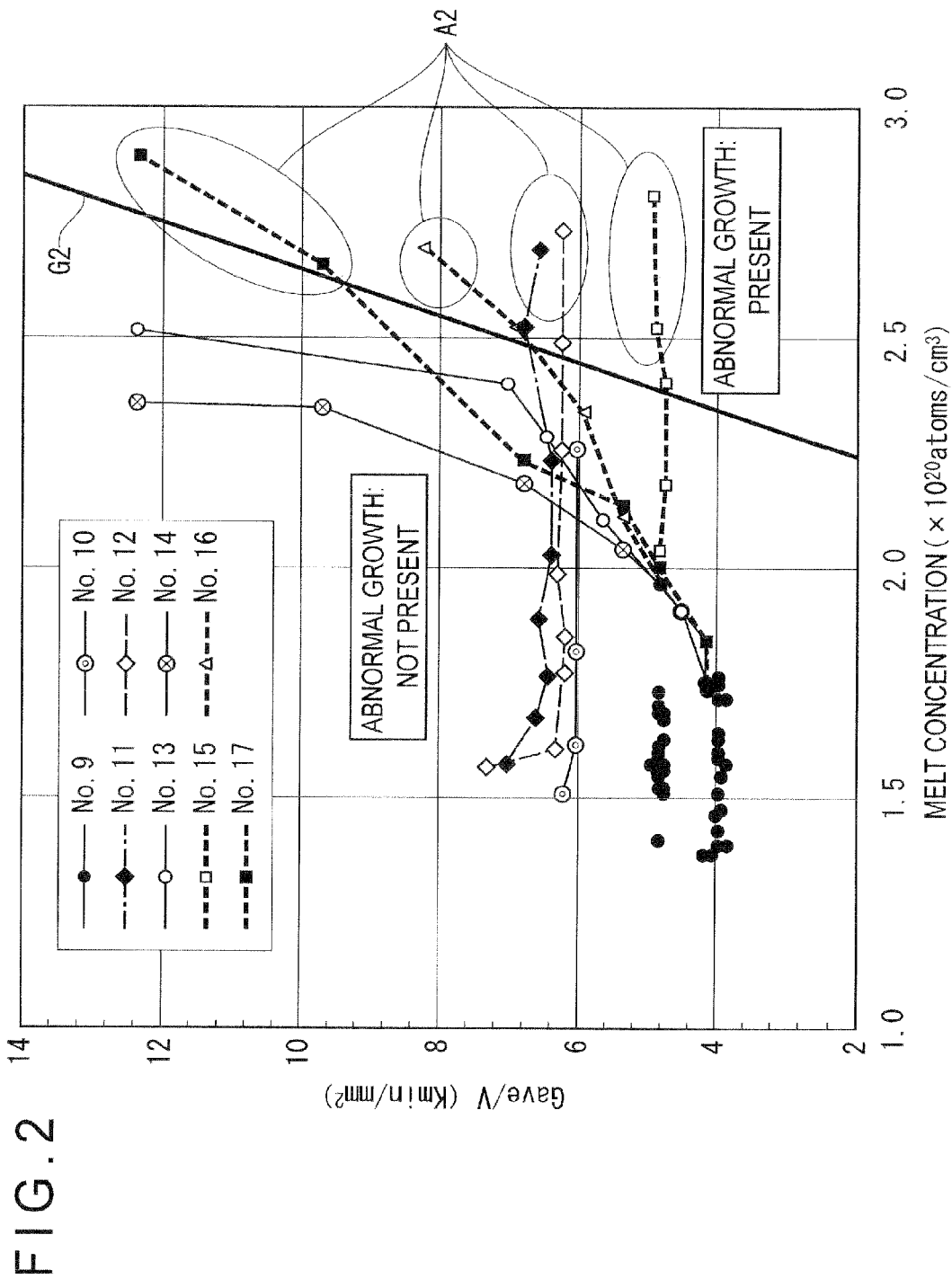
FIG. 2 is a graph showing a relationship between phosphorus concentration in a silicon melt and Gave/V according to another example of the invention.

Then, as in the example 1, a scatter diagram for showing the silicon crystals manufactured under the conditions shown in Tables 3 and 4 was drafted, in which an arsenic concentration (melt concentration) C (atoms/cm$^3$) in the silicon melt was plotted on the horizontal axis while a fraction Gave/V(Kmin/mm$^2$) between the average temperature gradient Gave (K/mm) and the pulling-up speed V (mm/min) was plotted on the vertical axis. As shown in FIG. 2, abnormal growth occurred in a region A2. It has been found that abnormal growth occurs in a region located to the right of a critical line G2 while no abnormal growth occurs in a region located to the left thereof.

At this time, a formula for representing the critical line G2 was calculated, and the following formula (11) was obtained.

[Formula 11]

$$\frac{Gave}{V} = 2.00 \times 10^{19} \times C - 43 \quad (11)$$

Accordingly, the condition for growing a silicon monocrystal without occurrence of abnormal growth is represented by the following formula (12). By growing a silicon monocrystal such that the relationship represented by the formula (12) is satisfied, abnormal growth due to compositional supercooling can be prevented.

[Formula 12]

$$\frac{Gave}{V} > 2.00 \times 10^{19} \times C - 43 \quad (12)$$

TABLE 3

|  |  | No. 9 | No. 10 | No. 11 | No. 12 | No. 13 |
|---|---|---|---|---|---|---|
|  | Charge amount (kg) | 100 | 100 | 100 | 100 | 100 |
|  | P doping amount (g) | 500 | 500 | 500 | 500 | 500 |
| Straight-portion condition | Pulling-up speed (mm/min) | 0.75 → 0.4 | 0.75 → 0.4 | 0.75 → 0.4 | 0.75 → 0.4 | 0.75 → 0.3 → 0.2 |
|  | Furnace pressure (Pa) | 59985 | 59985 | 59985 | 59985 | 59985 |
|  | Ar flow volume (L/min) | 200 → 70 | 200 | 200 | 200 | 200 |

TABLE 4

|  |  | No. 14 | No. 15 | No. 16 | No. 17 |
|---|---|---|---|---|---|
|  | Charge amount (kg) | 100 | 100 | 100 | 100 |
|  | P doping amount (g) | 500 | 500 | 500 | 500 |
| Straight-portion condition | Pulling-up speed (mm/min) | 0.75 → 0.2 | 0.75 → 0.5 | 0.75 → 0.3 | 0.75 → 0.2 |
|  | Furnace pressure (Pa) | 59985 | 73309 | 73309 | 73309 |
|  | Ar flow volume (L/min) | 200 | 200 | 200 | 200 |

As described in the above examples 1 and 2, from the scatter diagrams where the dopant concentration C (atoms/cm³) in the silicon melt is plotted on the horizontal axis while the fraction Gave/V between the average temperature gradient Gave (K/mm) of the crystal and the pulling-up speed V (mm/min) is plotted on the vertical axis, it has been found that abnormal growth can be prevented by growing a silicon monocrystal such that the relationship represented by the formula (1) is satisfied, no matter which of arsenic (As) and phosphorus (P) is used.

It has been also found that the coefficient A in the formula (1) is determined in accordance with a kind of the N-type dopant and that the intercept on the vertical axis is "−43".

By following the same method as in the examples 1 and 2, a coefficient A for antimony (Sb) is also obtained.

By cutting the silicon monocrystal grown in the method of the example 1 or 2 with, for instance, a wire saw, silicon monocrystal substrate(s) according to the aspect of the invention can be obtained.

The invention claimed is:

1. A method of manufacturing a silicon monocrystal, the silicon monocrystal being grown by the Czochralski method from a silicon melt with an N-type dopant added, the method comprising:
  preliminarily growing silicon monocrystals by the Czochralski method from silicon melts with the N-type dopant added under various dopant concentrations C (atoms/cm³), and obtaining for each of the grown monocrystals a ratio $G_{ave}/V$ between an average temperature gradient $G_{ave}$ (K/mm) and a pulling-up speed V (mm/min);
  preparing a scatter diagram of the dopant concentrations C and ratios $G_{ave}/V$ corresponding to the grown monocrystals, in which the dopant concentration C is plotted on a horizontal axis and the ratio $G_{ave}/V$ is plotted on a vertical axis;
  identifying in the scatter diagram a critical line at which compositional supercooling occurs; and
  based on the critical line, growing the silicon monocrystal such that $G_{ave}/V$ of the grown monocrystal has a value at which the compositional supercooling does not occur, at the dopant concentration C of the silicon melt.

2. The method according to claim 1, wherein:
the N-type dopant is arsenic; and
the silicon monocrystal is grown such that the following formula is satisfied:

$$\frac{G_{ave}}{V} > A \cdot C - 43 \tag{1}$$

where:
  A is $2.85 \times 10^{-19}$; and
  C is the dopant concentration in atoms/cm³.

3. The method according to claim 1, wherein:
the N-type dopant is phosphorus; and
the silicon monocrystal is grown such that the following formula is satisfied:

$$\frac{G_{ave}}{V} > A \cdot C - 43 \tag{2}$$

where:
  A is $2.00 \times 10^{-19}$; and
  C is the dopant concentration in atoms/cm³.

* * * * *